United States Patent [19]

Johnson

[11] Patent Number: 4,592,787
[45] Date of Patent: Jun. 3, 1986

[54] COMPOSITION USEFUL FOR STRIPPING PHOTORESIST POLYMERS AND METHOD

[75] Inventor: M. Anthony Johnson, Baton Rouge, La.

[73] Assignee: The Dow Chemical Company, Midland, Mich.

[21] Appl. No.: 668,546

[22] Filed: Nov. 5, 1984

[51] Int. Cl.⁴ .................... B08B 7/00; C09D 9/04
[52] U.S. Cl. ...................... 134/38; 252/153; 252/158; 252/171
[58] Field of Search ............... 134/38; 252/153, 158, 252/171

[56] References Cited

U.S. PATENT DOCUMENTS

| | | | |
|---|---|---|---|
| 3,574,123 | 4/1971 | Laugle | 134/38 X |
| 3,796,602 | 3/1974 | Briney et al. | 134/38 |
| 3,839,234 | 10/1974 | Roscoe | 252/153 X |
| 4,202,703 | 5/1980 | Zuber et al. | 134/38 X |

Primary Examiner—Joseph Golian
Attorney, Agent, or Firm—Norman L. Sims

[57] ABSTRACT

This invention is a composition suitable for stripping cross-linked photoresist polymer which comprises
(a) a lower alkyl monoether of a propylene glycol, or a mixture of lower alkyl monoethers of propylene glycol;
(b) a $C_{2-6}$ alkanol;
(c) an alkanolamine; and
(d) a base.

18 Claims, No Drawings

COMPOSITION USEFUL FOR STRIPPING PHOTORESIST POLYMERS AND METHOD

BACKGROUND OF THE INVENTION

This invention relates to a novel composition useful for stripping photoresist polymers from substrates. Furthermore, this invention relates to a method of stripping photoresist polymers with the novel composition.

Printed circuit boards are manufactured by plating a thin layer of copper on an epoxy-glass cloth laminate board of uniform thickness. A predetermined pattern of holes is then drilled to accommodate various electrical components. A film of partially polymerized photoresist plastic is deposited on the laminate over the copper plating. Photoresist films are commonly composed of acrylic resins, polyvinyl cinnamates, diazo compounds, phenol-formaldehydes, or other similar film-forming materials. This film is further polymerized, or cross-linked, by the action of ultraviolet light, into a hard chemically resistant film.

By masking with an appropriate glass or plastic material the resist film is selectively hardened by the exposure to light in specific predetermined areas, while the resist film in the masked areas is left unchanged. The unchanged resist film is then dissolved in a "developer" by a solvent such as 1,1,1-trichloroethane or a solution of butoxyethanol and sodium carbonate or similar solutions. The copper in the cleaned areas may then be removed by etching or additional copper and other metals may be plated thereon. In either event it then becomes necessary to remove the exposed hardened resist film from the laminate.

It is known that such resist films can be removed by the action of strong organic solvents, such as methylene chloride or trichloroethylene. A method of removing resist from printed circuit boards is described in U.S. Pat. No. 3,789,007 wherein the board is treated with a mixture of 85 to 97 percent by weight of methylene chloride with the balance being methanol. Other methylene chloride-containing photoresist stripper compositions are disclosed in U.S. Pat. No. 3,625,763 and 3,813,309. Archer et al., U.S. Pat. No. 4,438,192, disclose an improved photoresist stripper composition which contains methylene chloride, methanol and methyl formate.

Zuber et al., U.S. Pat. No. 4,202,703, disclose that a solution of tetramethylammonium hydroxide and a surfactant in a lower alcohol solubilizes photoresist films without attacking materials found in integrated circuit devices so that a subsequent 1,1,1-trichloroethane rinse completely removes the photoresist.

Briney, U.S. Pat. No. 3,796,602, discloses that photohardened resist masks are stripped from substrate surfaces, particularly metal surfaces of printed circuit boards, using an aqueous stripping liquid heated to near its phase-transition temperature, the composition containing from 1 to 50 percent of a partially miscible organic solvent. Aqueous stripping compositions useful are comprised of water as a major ingredient and at least one organic solvent which is partially miscible in water. Organic solvents found particularly useful include 2-butoxyethanol, ethylene glycol mono-isobutylether, ethylene glycol mono-n-hexylether, 2-propoxypropanol, 2-(2-butoxyethoxy)ethanol, diethylene glycol mono-n-hexylether, ethylene diacetate, diethyl malonate and furfural. Up to about 0.5 percent by weight of surfactants may be used. It is further taught that it may be desirable to add up to 10 percent of an alkaline agent.

In the many heretofore known stripping compositions for stripping photoresist, there are components which are toxic, corrosive, or are hazardous to use. Furthermore, many of these stripping compositions do not strip the photoresist in an expedient manner.

What is needed is a composition useful in stripping photoresist polymers from substrates which does not contain toxic reagents, does not contain corrosive agents, and does not contain reagents which are hazardous to use. Furthermore, what is needed is a composition which results in faster stripping of the photoresist polymer mask.

SUMMARY OF THE INVENTION

This invention is a composition suitable for stripping cross-linked photoresist polymer which comprises (a) a lower alkyl monoether of a propylene glycol, or a mixture of lower alkyl monoethers of propylene glycol;

(b) a $C_{2-6}$ alkanol;

(c) an alkanolamine; and (d) a base.

The composition of this invention is useful in stripping photoresist polymers from substrates, by contacting such substrates with such composition under conditions such that the photoresist polymers are removed from the substrates.

The composition of this invention is advantageous for this use as it contains less toxic reagents than heretofore used, its components are less corrosive than those heretofore used, and the components are less hazardous to use than those heretofore used. Furthermore, the composition of this invention exhibits surprisingly faster strip times than the heretofore known stripping compositions.

DETAILED DESCRIPTION OF THE INVENTION

Preferably, the composition of this invention comprises (a) between about 40 and 75 percent by weight of a lower alkyl monoether of a propylene glycol or a mixture of lower alkyl monoethers of propylene glycol;

(b) between about 10 and 30 percent by weight of a $C_{2-6}$ alkanol;

(c) between about 4 and 28 percent by weight of an alkanolamine; and (d) between about 1 and 14 percent by weight of a base.

More preferably, the composition of this invention comprises (a) between about 40 and 55 percent by weight of a lower alkyl monoether of a propylene glycol or a mixture of lower alkyl monoethers of propylene glycol;

(b) between about 17 and 25 percent by weight of a $C_{2-6}$ alkanol;

(c) between about 18 and 28 percent by weight of an alkanolamine; and (d) between about 2 and 6 percent by weight of a base.

Optionally, the composition of this invention may further comprise a nonionic surfactant. Preferably, the nonionic surfactant is present in an amount of between about 0.1 and 0.5 percent by weight. Preferably, this surfactant is a low foaming nonionic surfactant with an HLB of between about 12 to 16. Examples of useful fluorocarbon surfactants include Triton X-100, a product (an octylphenoxypolyethoxyethanol) of Rohm & Haas Company, Zonyl FSO ®, a surfactant (fluoroalkyl-poly(oxyethylene)ethanol) of Dupont and Tergitol MPX, a polyethylene glycol ether product of Union Carbide Corporation.

In one embodiment of this invention, the composition is an aqueous composition which comprises between about 15 and 99 percent by weight of the stripper compositions described hereinbefore and between about 1 and 85 percent of water. More preferably, the aqueous stripper composition comprises between about 15 and 25 percent by volume of the stripper compositions described hereinbefore and between about 75 and 80 percent by volume of water.

Any lower alkyl monoether of a propylene glycol, or a mixture of lower alkyl monoethers of propylene glycol, may be used in the invention. The lower alkyl monoethers of propylene glycol function as penetrating solvents in this composition, which dissolve the adhesive and lift the photoresist polymer from the substrate, so as to break up the coating. Further, the lower alkyl monoethers of propylene glycol serve as cosolvents for the photoresist polymer. Preferred lower alkyl monoethers of propylene glycol correspond to the formula

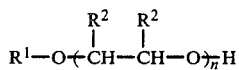

wherein
$R^1$ is $C_{1-4}$ alkyl;
$R^2$ is hydrogen or methyl; and
n is an integer of 1 to 3,
with the proviso that one $R^2$ in each unit is methyl and the other is hydrogen. Unit refers herein to the moiety

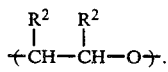

Examples of lower alkyl monoethers of propylene glycol useful in this invention include propylene glycol methylether, propylene glycol ethylether, propylene glycol propylether, propylene glycol isopropylether, propylene glycol butylether, propylene glycol isobutylether, dipropylene glycol methylether, dipropylene glycol ethylether, dipropylene glycol propylether, dipropylene glycol isopropylether, dipropylene glycol butylether, dipropylene glycol isobutylether, tripropylene glycol methylether, tripropylene glycol ethylether, tripropylene glycol propylether, tripropylene glycol isopropylether, tripropylene glycol butylether and tripropylene glycol isobutylether. More preferred lower alkyl monoethers of propylene glycol include propylene glycol methylether, propylene glycol ethylether, propylene glycol isopropylether, propylene glycol propylether, dipropylene glycol methylether, dipropylene glycol propylether, dipropylene glycol isopropylether and tripropylene glycol methylether. Most preferred are propylene glycol isopropylether and propylene glycol methylether.

Any $C_{2-6}$ alkanol is useful in this invention. The $C_{2-6}$ alkanol functions as a penetrating solvent and is a good wetting agent for the substrate. Examples of $C_{2-6}$ alkanols useful in this invention are ethanol, propanol, isopropanol, n-butanol, isobutanol, pentane and hexane. Preferred alkanols include ethanol, propanol, isopropanol, isobutanol, t-butanol and n-butanol. Most preferred is n-butanol.

Any alkanolamine is useful in this invention. The alkanolamines function as a buffer in the system to help maintain the pH of the composition at the desired levels. Furthermore, the alkanolamines function to protect the substrate by coating the substrate so as to prevent redeposition of the photoresist polymer on the substrate. Examples of alkanolamines useful in this invention include sec-butanolamine, di-sec-butanolamine, monoisopropanolamine, monoethanolamine, mono-sec-butanolmonoethanolamine, methyldiethanolamine, methylamino-2-methyl-1-propanol, dimethylethanolamine, aminoethylethanolamine, monopropanolamine, isopropanol-sec-butanolamine and the like. Preferred alkanolamines are monoethanolamine, monopropanolamine and monoisopropanolamine. Most preferred is monoisopropanolamine or monoethanolamine.

Bases useful in this invention are those which provide alkali metal, alkaline earth metal or ammonium ions in solution to form salts with acid sites of the photoresist polymer masks, and are capable of serving as a buffer to maintain the pH of the photoresist composition at 9 or greater. Preferred bases include alkali metal carbonates, alkali metal hydroxides, alkaline earth metal carbonates, alkaline earth metal hydroxides, ammonium carbonates and ammonium hydroxides. More preferred bases include alkali metal hydroxides, alkaline earth metal hydroxides and ammonium hydroxides. The most preferred base is ammonium hydroxide.

A preferred stripping composition comprises propylene glycol isopropylether, n-butanol, monoisopropanolamine and ammonium hydroxide. Another preferred stripping composition comprises propylene glycol methylether, n-butanol, monoisopropanolamine and ammonium hydroxide. Yet another preferred stripping composition is dipropylene glycol isopropylether, propylene glycol isopropylether, monoethanolamine, n-butanol and ammonium hydroxide.

This invention further comprises a method of stripping a cross-linked photoresist polymer off of a substrate which comprises contacting a substrate upon which a cross-linked photoresist polymer is adhered with a stripper composition comprising
(a) a lower alkyl monoether of a propylpene glycol or a mixture of lower alkyl monoethers of propylene glycols;
(b) a $C_{2-6}$ alkanol;
(c) an alkanolamine; and
(d) a base,
wherein the stripper composition has a pH of 9 or greater, at a temperature at which the stripper composition is a single phase, for a time sufficient to strip the cross-linked photoresist polymer from the substrate, under conditions such that the cross-linked photoresist polymer is stripped from the substrate.

The stripping composition preferably has a pH of 9 or greater. More preferably the stripping composition has a pH of between about 9 and 12, most preferably at a pH of between 9 and 11.5. Below a pH of 9, unwanted by-products are formed.

This process can be performed at any temperature at which the stripper composition removes the photoresist polymer from the substrate. The upper limit on the temperature is the temperature at which the composition begins to undergo phase separation. Preferably temperatures are between about 20° C. and 55° C., with temperatures of between about 25° C. and 50° C. being most preferred.

The substrate can be contacted with the stripping composition for a period of time sufficient to remove the photoresist polymer from the substrate. Preferable times are between about 1 and 5 minutes. More preferable times are between about 1 and 3 minutes.

Photoresist polymers which can be removed by the method of this invention include photohardened materials such as colloids and polymers prepared from photopolymerizable compositions like those described in Plambeck, U.S. Pat. No. 2,760,863; Alles, U.S. Pat. No. 3,458,311; and U.S. Pat. No. 3,475,171; Celeste, U.S. Pat. No. 3,469,982; and Hurley, U.S. Pat. No. 3,622,334. The photoresist polymer may also be prepared from photocross-linkable and photodimerizable compositions like those described in Celeste, U.S. Pat. No. 3,526,504; Minsk et al., U.S. Pat. No. 2,670,286; Giangualano et al., U.S. Pat. No. 3,462,267; and in chapter 4 of "Light Sensitive Systems" by Joaromir Kosar, published by John Wiley & Sons, Inc., New York. Disclosures of the above-cited references are incorporated herein by reference. Besides the photoresist polymers, the method of this invention can also be used to remove polymer or colloid masks produced from other compositions and processes such as thermographic, photosolubilization, photodeactivation, and the like. Such processes involve imaging with heat or radiant energy with one or more physical or chemical steps to produce masks. The process of invention is also useful in removing heat hardened resistings laid down by conventional screening processes.

Preferred photoresist polymers which the stripping composition of this invention is especially effective in removing include those derived from acrylic acids, such as methacrylic acid, and acrylate esters, such as methylmethacrylate, for example Riston ® (a trademark of DuPont) and Laminar ® (a trademark of Dynachem).

The substrates which may be stripped in this invention can include any substrate to which has been applied a photoresist polymer. Preferred substrates include circuit boards.

The substrates may be contacted with the stripping composition in one of many ways. In one embodiment, the substrate is placed in a dip tank or bath for a time sufficient for the photoresist polymer to be removed from the substrate. In another embodiment, the stripper composition may be sprayed on the substrate for a period of time sufficient to remove the photoresist polymer. Both horizontal and vertical spraying mechanisms may be used. In another embodiment, a dip tank or bath can be used in which full jet nozzles apply pressure to the substrate.

Under some preferred embodiments, upon removing the substrate from contact with the stripping composition, the substrate can be rinsed with water so as to remove all remaining photoresist polymer and any residual stripping composition.

The composition of this invention is further useful as an ink solvent, a wax stripper, and the like.

SPECIFIC EMBODIMENTS

The following examples are included for illustrative purposes only, and do not limit the scope of the claims or the invention. Unless otherwise stated, all parts and percentages are by weight.

EXAMPLE 1

A Rupture Tests

Onto a printed circuit board coated with a photoresist polymer comprising methylmethacrylate and acrylic acid copolymer is applied one drop of a photoresist stripping composition. The area where the stripping composition is applied is observed to determine the time (in seconds) necessary to fracture and lift the film from the board. Lower times are preferred in commercial operations.

This test is run with a number of compositions. The compositions and the times are noted in Table I.

TABLE I

| Run | Glycol Ether | % Glycol Ether | % n-Butanol | % Monoethanolamine | % Ammonium Hydroxide | (sec) Strip Time |
|---|---|---|---|---|---|---|
| 1 | A | 50.0 | 22.0 | 24.0 | 4.0 | 89 |
| 2 | A | 48.7 | 22.0 | 24.0 | 5.3 | 86 |
| 3 | A | 45.4 | 26.0 | 24.0 | 4.6 | 94 |
| 4 | A | 46.4 | 23.0 | 26.0 | 4.6 | 92 |
| 5 | A | 49.85 | 25.0 | 25.0 | 4.65 | 104 |
| 6 | A | 47.63 | 24.5 | 24.5 | 4.62 | 91 |
| 7 | A | 49.97 | 23.25 | 23.25 | 4.66 | 101 |
| 8 | A | 50.0 | 22.0 | 24.0 | 4.0 | 88 |
| 9 | B | 50.0 | 22.0 | 24.0 | 4.0 | 124 |
| 10 | C | 50.0 | 22.0 | 24.0 | 4.0 | 141 |

A - propylene glycol isopropylether
B - propylene glycol ethylether
C - propylene glycol methylether

EXAMPLE 2

Rupture Test Aqueous Stripping Composition

A stripping composition comprising propylene glycol isopropylether, butanol, ammonium hydroxide, and monoethanolamine is diluted in water and then a rupture test as described in Example 1 is run. The compositions and results are shown in Table II.

TABLE II

| Run | Stripping Composition % by Wt | | | | | WSC (vol) | Time (sec) |
|---|---|---|---|---|---|---|---|
| | GE | B | AH | ME | Water | | |
| 1 | 50 | 22 | 4 | 24 | — | 4:1 | 136 |
| 2 | 48.7 | 22 | 4 | 24 | — | 4:1 | 139 |
| 3 | 45 | 22 | 4 | 24 | 5 | 3:1 | 83 |
| 4 | 45 | 22 | 4 | 24 | 5 | 4:1 | 112 |
| 5 | 43.7 | 22 | 5.3 | 24 | 5 | 3:1 | 98 |
| 6 | 43.7 | 22 | 5.3 | 24 | 5 | 4:1 | 122 |

GE - glycol ether
B - butanol
AH - ammonium hydroxide
ME - monoethanolamine
WSC - water to stripping composition ratio

EXAMPLE 3

Bath Test

A printed circuit board of the size 4×6 inches (10.26×15.38 cm), with a photoresist polymer mask, comprising a copolymer of methylmethacrylate and acrylic acid, is dipped into a bath of stripping composition wherein the bath size is 28×36×8 inches (71.79×92.31×20.51 cm). The time for complete removal of the photoresist polymer mask is observed. The stripping composition comprises 49.6 percent of propylene glycol isopropylether, 4 percent of ammonium hydroxide, 22 percent of butanol, 24 percent of monoethanolamine and 0.4 percent of Zonyl FSO, a nonionic fluorocarbon surfactant. The thickness of the polymer on the board is 1.5 mm. The results are contained in Table III.ic fluorocarbon surfactant. The thickness of the polymer on the board is 1.5 mm. The results are contained in Table III.

TABLE III

| Run | Bath Temperature (°C.) | Time (sec) |
|---|---|---|
| 1 | ~20* | 90 |
| 2 | 30 | 74 |
| 3 | 40 | 63 |
| 4 | 49 | 48 |

What is claimed is:

1. A composiion suitable for stripping cross-linked photoresist polymer which comprises
   (a) between about 40 and 75 percent by weight of a lower alkyl monoether of a propylene glycol, or a mixture of lower alkyl monethers of propylene glycol;
   (b) between about 10 and 30 percent by weight of a $C_{2-6}$ alkanol;
   (c) between about 4 and 28 percent by weight of an alkanolamine; and
   (d) between about 1 and 14 percent by weight of a base wherein the base is an alkali metal hydroxide, alkaline earth metal hydroxide, ammonium hydroxide, alkali metal carbonate, alkaline earth metal carbonate or ammonium carbonate.

2. The composition of claim 1, wherein lower alkyl monoethers of propylene glycol correspond to the formula

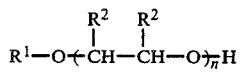

wherein
$R^1$ is $C_{1-4}$ alkyl;
$R^2$ is hydrogen or methyl; and
n is an integer of 1 to 3,
with the proviso that one $R^2$ in each unit is methyl and the other is hydrogen.

3. The composition of claim 1 which comprises
   (a) between about 40 and 55 percent by weight of a lower alkyl monoether of a propylene glycol or a mixture of lower alkyl ethers of propylene glycol;
   (b) between about 17 and 25 percent by weight of a $C_{2-6}$ alkanol;
   (c) between about 18 and 28 percent by weight of an alkanolamine; and
   (d) between about 2 and 6 percent by weight of a base.

4. The composition of claim 1 wherein the alkanolamine is monoethanolamine, monopropanolamine or monoisopropanolamine, and the base is an alkali metal hydroxide, alkaline earth hydroxide or an ammonium hydroxide.

5. The composiion of claim 4 which comprises
   (a) propylene glycol methylether;
   (b) n-butanol;
   (c) monoisopropanolamine; and
   (d) ammonium hydroxide.

6. The composition of claim 4 which comprises
   (a) dipropylene glycol isopropylether;
   (b) propylene glycol isopropylether;
   (c) monoethanolamine;
   (d) n-butanol; and
   (e) ammonium hydroxide.

7. The composition of claim 4 which comprises
   (a) propylene glycol isopropylether;
   (b) n-butanol;
   (c) monoisopropanolamine; and
   (d) ammonium hydroxide.

8. The composition of claim 1 which further comprises between about 0.1 and 0.5 percent by weight of a nonionic surfactant.

9. An aqueous composition suitable for stripping cross-linking photoresist polymers which comprises (a) between about 15 and, 99 percent by volume of the composition of claim 1, and (2) between 1 and 85 percent by volume of water.

10. An aqueous composition suitable for stripping cross-linking photoresist polymers which comprises (1) between about 15 and 25 percent by volume of the composition of claim 1, and (2) between about 75 and 85 percent by volume of water.

11. A method of stripping corss-linked photoresist polymer from a substrate which comprises contacting a substrate upon which a cross-linked photoresist polymer is adhered with a stripper composition comprising
   (a) between about 40 and 75 percent by weight of a lower alkyl monoether of a propylene glycol, or a mixture of lower alkyl monoethers of propylene glycol;
   (b) between about 10 and 30 percent by weight of a $C_{2-6}$ alkanol;
   (c) between about 4 and 28 percent by weight of an alkanolamine; and
   (d) between about 1 and 14 percent by weight of a base wherein the base is an alkali metal hydroxide, alkaline earth metal hydroxide, ammonium hydroxide, alkali metal carbonate, alkaline earth metal carbonate or ammonium carbonate;
wherein the stripper composition has a pH of 9 or greater, at a temperature at which the stripper composition is a single phase, for a time sufficient to strip the cross-linked photoresist polymer from the substrate, under conditions such that the cross-linked photoresist polymer is stripped from the substrate.

12. The method of claim 11 wherein the lower alkyl monoethers of propylene glycols correspond to the formula

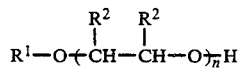

wherein
$R^1$ is $C_{1-4}$ alkyl;
$R^2$ is hydrogen or methyl; and
n is an integer of from 1 to 3,
with the proviso that $R^2$ in each unit is methyl and the other $R^2$ is hydrogen.

13. The method of claim 14 wherein the stripper composition further comprises between about 0.1 and 0.5 percent by weight of a nonionic surfactant.

14. The method of claim 13 wherein the stripper composition comprises (1) between about 15 and 99 percent by volume of a composition which comprises
   (a) between about 40 and 75 percent by weight of a lower alkyl monoether of a propylene glycol or a mixture of lower alkyl monoethers of propylene glycols;
   (b) between about 10 and 30 percent by weight of a $C_{2-6}$ alkanol;

(c) between about 4 and 28 percent by weight of an alkanolamine;

(d) between about 1 and 14 percent by weight of a base; and (e) between about 0.1 and 0.5 percent by weight of a nonionic surfactant, and (2) between about 1 and 85 percent by volume of water.

15. The method of claim 14 wherein the contacting is performed at a temperature of between about 20° C. and 50° C.

16. The method of claim 15 wherein the substrate is a printed circuit board.

17. The method of claim 15 wherein the substrate is immersed in a bath of the stripping composition.

18. The method of claim 15 wherein the stripping composition is sprayed on the substrate.

* * * * *